(12) United States Patent
Park

(10) Patent No.: US 8,779,508 B2
(45) Date of Patent: Jul. 15, 2014

(54) SEMICONDUCTOR DEVICE AND METHOD FOR MANUFACTURING THE SAME

(71) Applicant: SK hynix Inc., Icheon-si (KR)

(72) Inventor: Jin Chul Park, Suwon-si (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/719,049

(22) Filed: Dec. 18, 2012

(65) Prior Publication Data

US 2014/0054689 A1 Feb. 27, 2014

(30) Foreign Application Priority Data

Aug. 24, 2012 (KR) .................. 10-2012-0093282

(51) Int. Cl.
*H01L 29/66* (2006.01)
(52) U.S. Cl.
USPC .......................................... 257/331; 257/330
(58) Field of Classification Search
CPC ............................ H01L 29/78; H01L 29/7827
USPC ................................................. 257/331, 316
See application file for complete search history.

(56) References Cited

U.S. PATENT DOCUMENTS

| 6,124,608 A * | 9/2000 | Liu et al. ...................... 257/315 |
| 6,541,815 B1 * | 4/2003 | Mandelman et al. ......... 257/315 |
| 7,056,792 B2 * | 6/2006 | Lin .............................. 438/259 |
| 2006/0033150 A1 * | 2/2006 | Shin ............................. 257/316 |
| 2008/0211057 A1 | 9/2008 | Lee et al. |
| 2009/0289294 A1 * | 11/2009 | Izumi ........................... 257/316 |
| 2011/0186927 A1 | 8/2011 | Kawaguchi et al. |

FOREIGN PATENT DOCUMENTS

KR 1020080064372 A 7/2008

* cited by examiner

*Primary Examiner* — A. Sefer

(57) ABSTRACT

A semiconductor device includes a semiconductor substrate with a cell region, a second pad region, and a first pad region between the second pad region and the cell region, a first buried gate buried in a trench of the semiconductor substrate, and extended from the cell region to the second pad region, and a second buried gate buried in the trench of the semiconductor substrate, disposed over and spaced apart from an upper part of the first buried gate, and extended from the cell region to the first pad region.

15 Claims, 7 Drawing Sheets

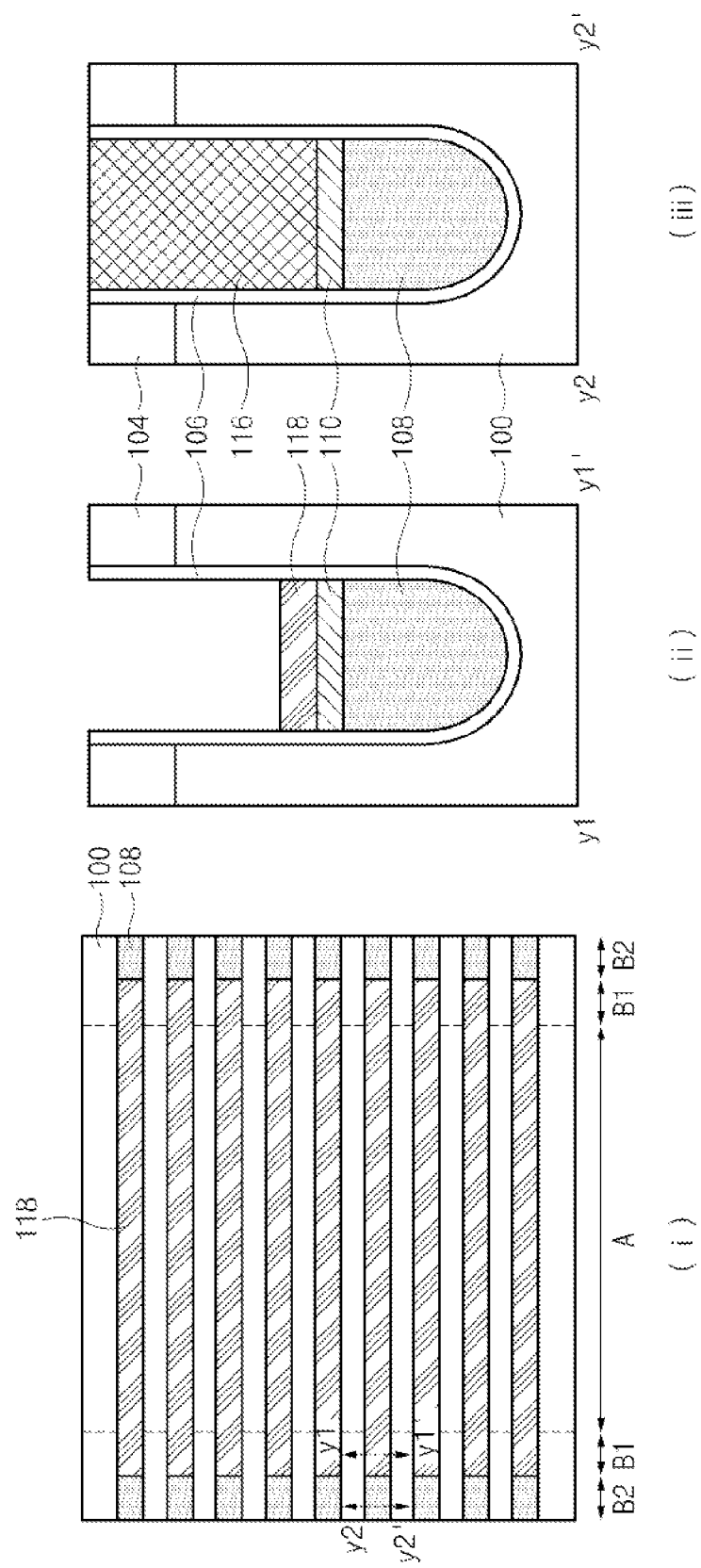

SEMICONDUCTOR DEVICE AND METHOD FOR MANUFACTURING THE SAME

CROSS-REFERENCE TO RELATED APPLICATION

The priority of Korean patent application No. 10-2012-0093282 filed on 24 Aug. 2012, the disclosure of which is hereby incorporated in its entirety by reference, is claimed.

BACKGROUND OF THE INVENTION

Embodiments of the present invention relate to a semiconductor device, and more particularly to a semiconductor device in which different voltages are applied to an upper buried gate overlapped with an ion implantation region according to a turn-on state or a turn-off state, and a method for manufacturing the same.

Recently, most electronic devices include at least one semiconductor device. Semiconductor devices include electronic elements such as transistors, resistors and capacitors that perform functions of the electronic appliances and are integrated on a semiconductor substrate. For example, an electronic appliance, such as a computer or a digital camera, may include a memory chip for storing information and a processing chip for controlling information. The memory chip and the processing chip include electronic elements integrated on a semiconductor substrate.

The degree of integration in semiconductor devices has been increasing in order to satisfy consumer demands for superior performance and low prices. An increase in the integration degree of a semiconductor device entails less tolerance in a design rule, thus requiring patterns of the semiconductor device to be significantly reduced. Although chip area is increased in proportion to an increase in memory capacity as the semiconductor device becomes miniaturized and more highly integrated, a unit cell area, where patterns of a semiconductor device are actually formed, decreases. Accordingly, since a greater number of patterns should be formed in a limited unit area in order to achieve a desired memory capacity, there is a need for formation of microscopic (fine) patterns having a reduced critical dimension (CD: a minimum pattern size available under a given condition).

Previously, various methods for forming microscopic patterns have been developed, including, for example, a method using a phase shift mask as a photo mask, a Contrast Enhancement Layer (CEL) method in which a separate thin film capable of enhancing image contrast is formed on a wafer, a Tri Layer Resist (TLR) method in which an intermediate layer, such as, for example, a Spin On Glass (SOG) film, is interposed between two photoresist films, and a silylation method for selectively implanting silicon into an upper part of a photoresist film.

Meanwhile, with the increasing integration of semiconductor devices, the length of a channel is reduced, so that high-density channel doping is necessary for transistor characteristics and to prevent deterioration of refresh characteristics. To accomplish this, there is a newly proposed technology for reducing bit line capacitance in which a recess gate structure is configured as a buried gate structure so that a gate is formed at a lower part of a bit line and both capacitance between the gate and the bit line and total capacitance of the bit line is reduced.

Generally, in the case of a buried gate, a semiconductor substrate is etched to a predetermined depth to form a trench, a gate metal is formed over the entirety of the substrate to bury the trench, and an etchback process is then performed on a gate electrode in such a manner that only the gate electrode of a predetermined thickness remains. In the etchback process, variation in the etched-back depth may occur.

When variation in the etched-back depth occurs, a junction region and a gate metal overlap with each other in response to a thickness of the remaining gate metal. In this case, gate induced drain leakage (GIDL) occurs so that a retention time of a cell is reduced, resulting in deterioration of the semiconductor device characteristics.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device and a method for forming the same, which can solve the problems of the related art in which GIDL occurs because a junction region is coupled to a gate metal as a result of variation in an etchback fabrication such that a cell retention time is reduced and semiconductor device characteristics are deteriorated.

In accordance with an aspect of the present invention, a semiconductor device includes a semiconductor substrate including a cell region, a second pad region on one side of the cell region, and a first pad region disposed between the cell region and the second pad region and contiguous to the cell region and the second pad region; a first buried gate buried in the bottom of a trench of the semiconductor substrate, and extended from the cell region to the second pad region; and a second buried gate buried in the bottom of a trench of the semiconductor substrate, spaced apart from an upper part of the first buried gate, and extended from the cell region to the first pad region.

The semiconductor device may further include: a first metal contact formed at an end part of the first buried gate; and a second metal contact formed at an end part of the second buried gate.

The first metal contact may be alternately formed at one end of the first buried gate and the other end of the first buried gate contiguous to the one end.

The second metal contact may be alternately formed at one end of the second buried gate and the other end of the second buried gate contiguous to the one end.

In the first pad region and the second pad region, the first metal contact and the second metal contact may be arranged in a zigzag manner.

If the first metal contact is formed at one side of the first buried gate, the second metal contact may be formed at the other side of the second buried gate formed over the first buried gate.

The first buried gate may be longer than the second buried gate.

The second buried gate may be formed over the first buried gate to expose both ends of the first buried gate.

The second buried gate may come into contact with an ion implantation region contained in the semiconductor substrate of the cell region.

The semiconductor device may further include an isolation insulation film interposed between the first buried gate and the second buried gate.

The isolation insulation film may include a nitride film.

The semiconductor device may further include a sealing insulation film formed over the first buried gate and the second buried gate so as to be buried in the trench.

The semiconductor device may further include: if the first buried gate and the second buried gate are turned on, applying a turn-on voltage to the first metal contact and the second metal contact.

The semiconductor device may further include: if the first buried gate and the second buried gate are turned off, applying a turn-off voltage to the first metal contact and applying no voltage to the second metal contact.

If no voltage is applied to the second metal contact, the second buried gate may be floated.

In accordance with another aspect of the present invention, a method for forming a trench in a semiconductor substrate that includes a cell region, a second pad region on one side of the cell region, and a first pad region disposed between the cell region and the second pad region and contiguous to the cell region and the second pad region; forming a first buried gate buried in the bottom of a trench of the semiconductor substrate in such a manner that the first buried gate is extended from the cell region to the second pad region; and forming a second buried gate spaced apart from an upper part of the first buried gate in such a manner that the second buried gate is extended from the cell region to the first pad region.

The method may further include: after forming the first buried gate, forming an isolation insulation film over the first buried gate; forming a buried insulation film over the isolation insulation film; forming a mask pattern to open the second pad region; and etching a buried insulation film of the second pad region using the mask pattern as an etch mask.

The isolation insulation film may include a nitride film.

The buried insulation film may include a spin on carbon (SOC).

The method may further include: forming a first sealing insulation film over the isolation insulation film of the second pad region.

The forming of the second buried gate may include: removing the buried insulation film from the cell region and the first pad region; forming a metal layer over the isolation insulation film of the cell region and the first pad region; and performing an etchback process on the metal layer.

The forming of the second buried gate may include forming the second buried gate to overlap with an ion implantation region contained in the semiconductor substrate.

The first buried gate may be longer than the second buried gate.

The second buried gate may be formed over the first buried gate to expose both ends of the first buried gate.

The method may further include: after forming the second buried gate, forming a second sealing insulation film over the second buried gate; forming a first contact hole by etching a first sealing insulation film, and at the same time forming a second contact hole by etching the second sealing insulation film to expose the second buried gate; and filling the first contact hole and the second contact hole with a metal layer, thereby forming not only a first metal contact coupled to an end part of the first buried gate but also a second metal contact coupled to an end part of the second buried gate.

The first metal contact may be alternately formed at one end of the first buried gate and the other end of the first buried gate contiguous to the one end.

The second metal contact may be alternately formed at one end of the second buried gate and the other end of the second buried gate contiguous to the one end.

In the first pad region and the second pad region, the first metal contact and the second metal contact may be arranged in a zigzag manner.

If the first metal contact is formed at one side of the first buried gate, the second metal contact may be formed at the other side of the second buried gate formed over the first buried gate.

Each of the first sealing insulation film and the second insulation film may be formed of a nitride film.

The method for forming the semiconductor device may further include, if the first buried gate and the second buried gate are turned on, applying a turn-on voltage to the first metal contact and the second metal contact.

The method for forming the semiconductor device may further include: if the first buried gate and the second buried gate are turned off, applying a turn-off voltage to the first metal contact and applying no voltage to the second metal contact.

The method for forming the semiconductor device may further include, if no voltage is applied to the second metal contact, the second buried gate is floated.

It is to be understood that both the foregoing general description and the following detailed description of the present invention are only exemplary and are intended to provide further explanation of the invention as claimed, but are not limited to the described embodiments.

BRIEF DESCRIPTION OF THE DRAWINGS

FIGS. 2E to 2G illustrate a method for forming a semiconductor device according to an embodiment of the present invention.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
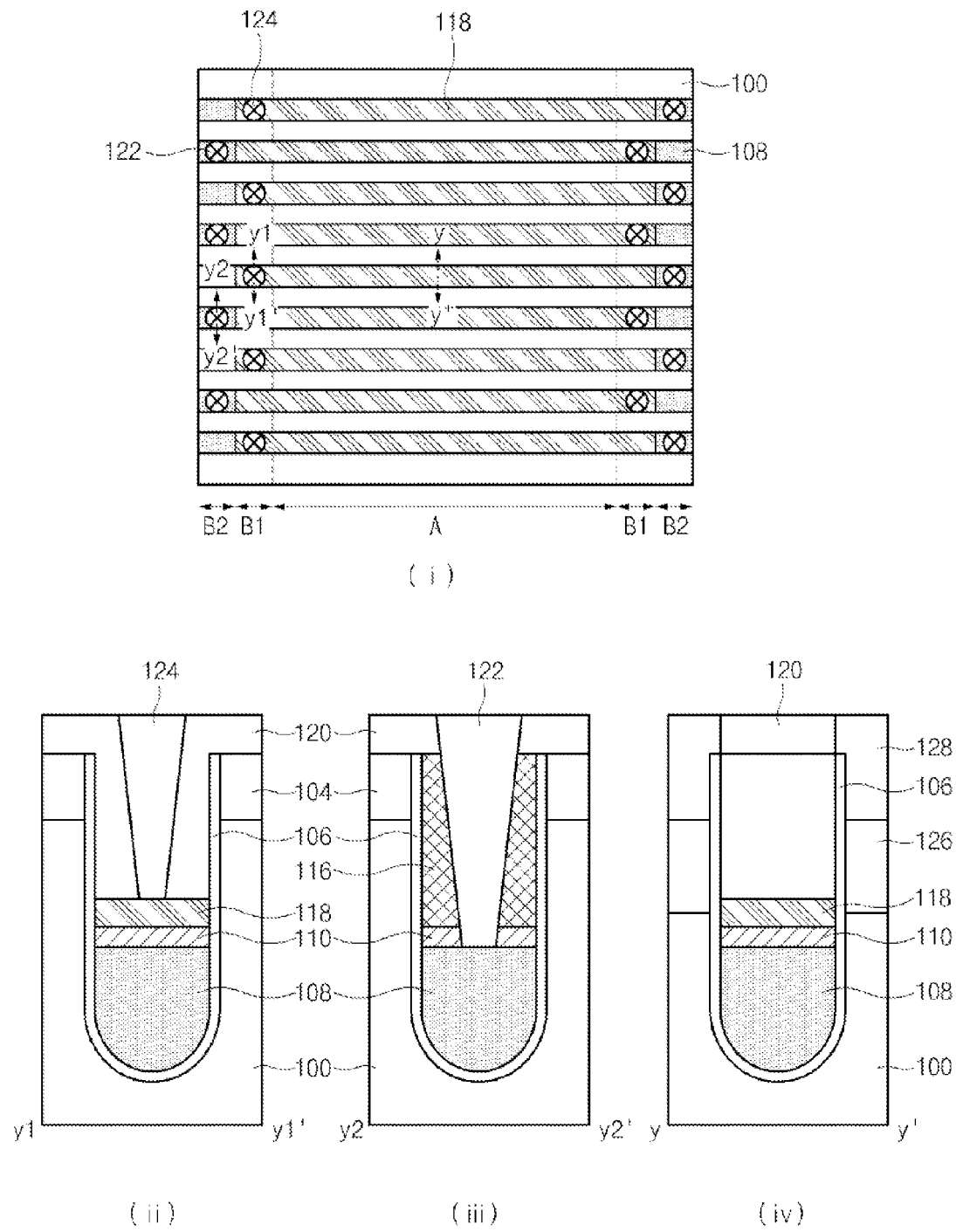
FIG. 1 illustrates a semiconductor device according to an embodiment of the present invention.

FIG. 1 illustrates a semiconductor device according to an embodiment of the present invention. In more detail, FIG. 1(i) is a plan view illustrating a semiconductor device, FIG. 1(ii) is a cross-sectional view illustrating a semiconductor device taken along the line y1-y1' of FIG. 1(i), FIG. 1(iii) is a cross-sectional view illustrating a semiconductor device taken along the line y2-y2' of FIG. 1(i), and FIG. 1(iv) is a cross-sectional view illustrating a semiconductor device taken along the line y-y' of FIG. 1(i).

Referring to FIGS. 1(i), 1(ii), and 1(iii), a semiconductor device according to an embodiment of the present invention includes a semiconductor substrate 100, a first buried gate 108, and a second buried gate 118. The semiconductor substrate 100 includes a cell region A, first pad regions B1 contiguous to opposing sides of the cell region A, and second pad region B2 contiguous to the first pad regions B1. The first buried gate 108 is buried in a trench of the semiconductor substrate 100, and extends from the cell region A to the second pad region B2. The second buried gate 118 is buried in a trench of the semiconductor substrate 100, is spaced apart from an upper part of the first buried gate 108, and extends from the cell region A to the first pad region B1. In an embodiment which includes first and second pad regions on two sides of a semiconductor, the first buried gate 108 may extend between a second pad region on one side of the semiconductor to a second pad region on the other side of the semiconductor, and the second buried gate 118 may extend between a first pad region on one side of the semiconductor to a first pad region on the other side of the semiconductor.

In an embodiment, the first buried gate 108 is longer than the second buried gate 118. In another embodiment, the second buried gate 118 may be formed over the first buried gate 108 to expose both ends of the first buried gate 108 forming a contact configured to apply a bias voltage to each buried gate at the end part of each buried gate.

In an embodiment, a semiconductor device according to the present invention includes a first metal contact 122 formed at the end part of the first buried gate 108 and a second metal contact 124 formed at the end part of the second buried gate 118. Because different contacts are coupled to the end parts of the first buried gate 108 and the second buried gate 118, it is possible to apply different bias voltages to the first buried gate 108 and the second buried gate 118.

The first metal contact 122 may be located at a first end of the first buried gate 108, and another first metal contact 122 may be disposed on a second end of a neighboring first buried gate 108. In other words, as seen in FIG. 1, the first metal contacts are alternately coupled to the first end and the second end of neighboring first buried gates. Similarly, the second metal contact 124 may be alternately located at opposite ends of the second buried gate 118. In other words, as seen in FIG. 1, the second metal contacts are alternately coupled to the first end and the second end of neighboring second buried gates.

In the first pad region B1 and the second pad region B2, the first metal contact 122 and the second metal contact 124 may be arranged in a zigzag manner. For example, if the first metal contact 122 is located at one side of the first buried gate 108, the second metal contact 124 may be located at the other side of the second buried gate 118 formed over the first buried gate 108. Therefore, as used herein, the term "zigzag manner" refers to the alternating arrangement of contacts along first and second pad regions B1 and B2 on both sides of the semiconductor as seen in FIG. 1.

Referring to FIG. 1(iv), the second buried gate 118 may overlap with an ion implantation region 126 contained in the semiconductor substrate 100 in the cell region A. In current approaches, if a conventional buried gate overlaps with the ion implantation region, channel resistance is reduced, but gate induced drain leakage (GIDL) occurs. In contrast, embodiments of the present invention can prevent the occurrence of GIDL while simultaneously decreasing channel resistance.

Assuming that the first buried gate 108 and the second buried gate 118 are turned on, it is preferable that a turn-on voltage is applied to the first metal contact 122 and the second metal contact 124. Since both the first buried gate 108 and the second buried gate 118 are turned on, channel resistance is decreased, such that a drive voltage of the semiconductor device is also reduced and the operation speed of the semiconductor device is increased.

In addition, assuming that the first buried gate 108 and the second buried gate 118 are turned off, it is preferable that a turn-off voltage is applied to the first metal contact 122 and is not applied to the second metal contact 124. If no voltage is applied to the second metal contact 124, the second buried gate 118 is floated. That is, the first buried gate 108 is turned off and the second buried gate is maintained in a floated state, such that a GIDL current is prevented from being generated, and thus electric charges stored in a storage node are not lost or compromised.

Different voltages are applied to the second buried gate 118 overlapping with the ion implantation region 126 according to the turn-on state or the turn-off state, such that channel resistance can be reduced while preventing GIDL from occurring.

In an embodiment, an isolation insulation film 110 is disposed between the first buried gate 108 and the second buried gate 118. In an embodiment, the isolation insulation film 110 may further include a nitride film. A sealing insulation film 120 is formed over the first buried gate 108 and the second buried gate 118 such that it is buried in a trench. A contact 128 may be formed over an ion implantation region 126. The contact 128 may further include a storage node contact or a bit line contact.

The first buried gate 108 and the second buried gate 118 may be driven by a word line.

A method for forming the above-mentioned semiconductor device according to an embodiment of the present invention will hereinafter be described with reference to FIGS. 2A to 2H.

FIGS. 2A to 2D are cross-sectional views illustrating a method for forming a semiconductor device in a cell region according to an embodiment of the present invention.

Figure 2A:
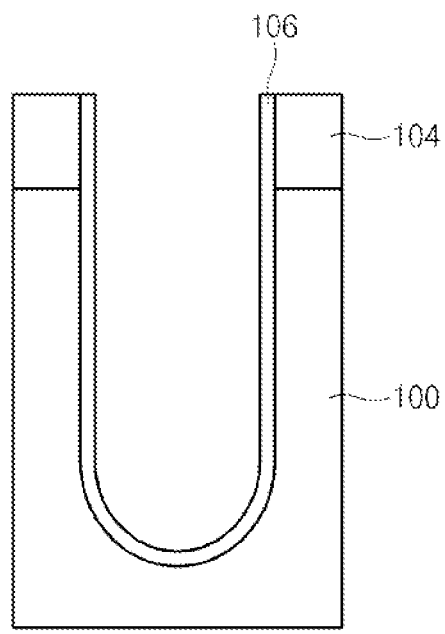
FIGS. 2A to 2D are cross-sectional views illustrating a method for forming a semiconductor device in a cell region according to an embodiment of the present invention.

Referring to FIG. 2A, after forming a hard mask pattern 104 over the semiconductor substrate 100, a trench is formed by etching the semiconductor substrate 100 using the hard mask pattern 104 as a mask, and a gate oxide film 106 is formed over the trench.

Figure 2B:
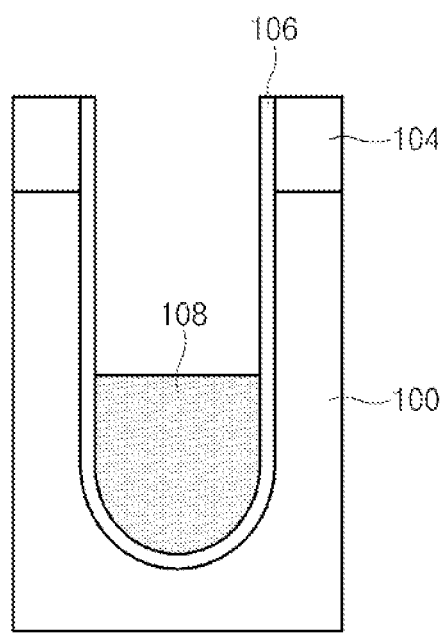

Referring to FIG. 2B, after forming a metal layer over the semiconductor substrate 100 including the trench, the metal layer is etched back so that a first buried gate 108 is formed at the bottom of the trench.

Figure 2C:
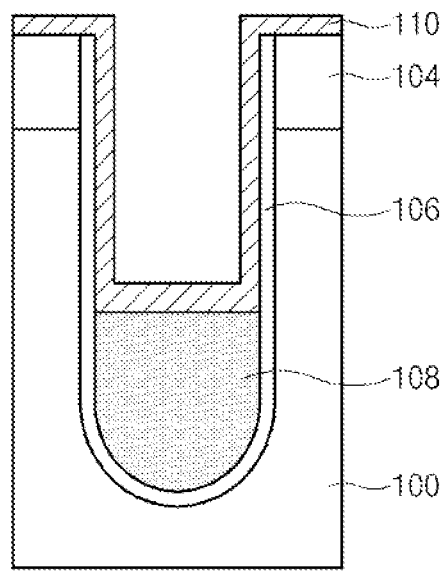

Referring to FIG. 2C, an isolation insulation film 110 is formed over the semiconductor substrate 100 including the first buried gate 108. In an embodiment, the isolation insulation film 110 may include a nitride film, and may be formed using a physical vapor deposition (PVD) process.

Figure 2D:
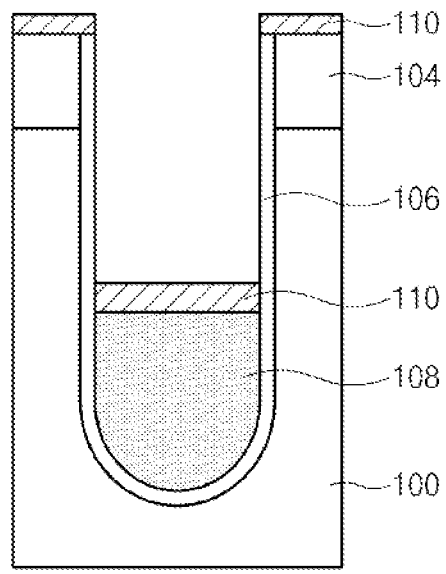

Referring to FIG. 2D, the isolation insulation film 110 is etched back so that the isolation insulation film 110 remains over the first buried gate 108 and over the hard mask pattern 104. Thereafter, portions of the isolation insulation film 110 formed over the hard mask pattern 104 may be removed.

Figure 2E:
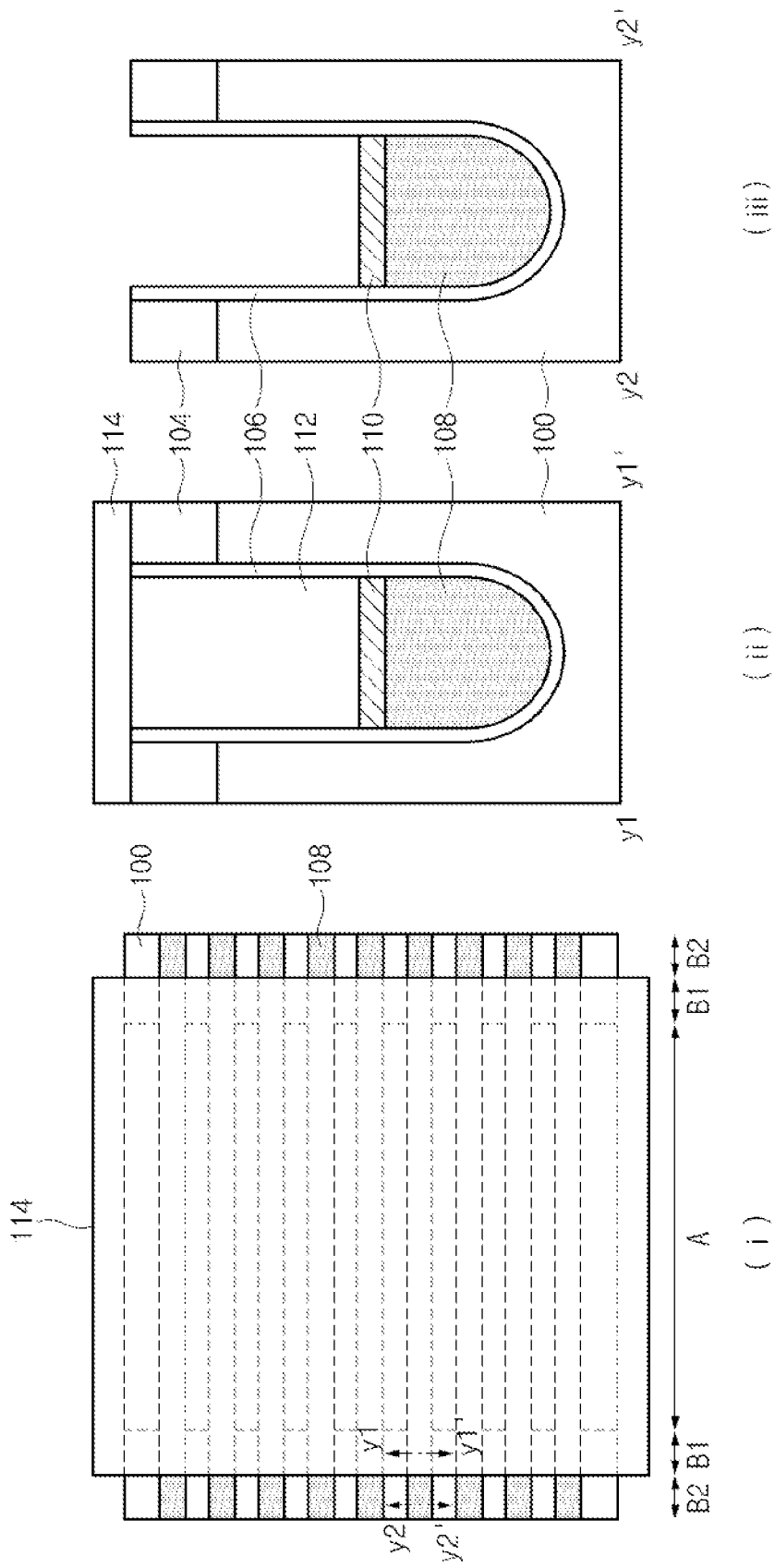
Figure 2F:
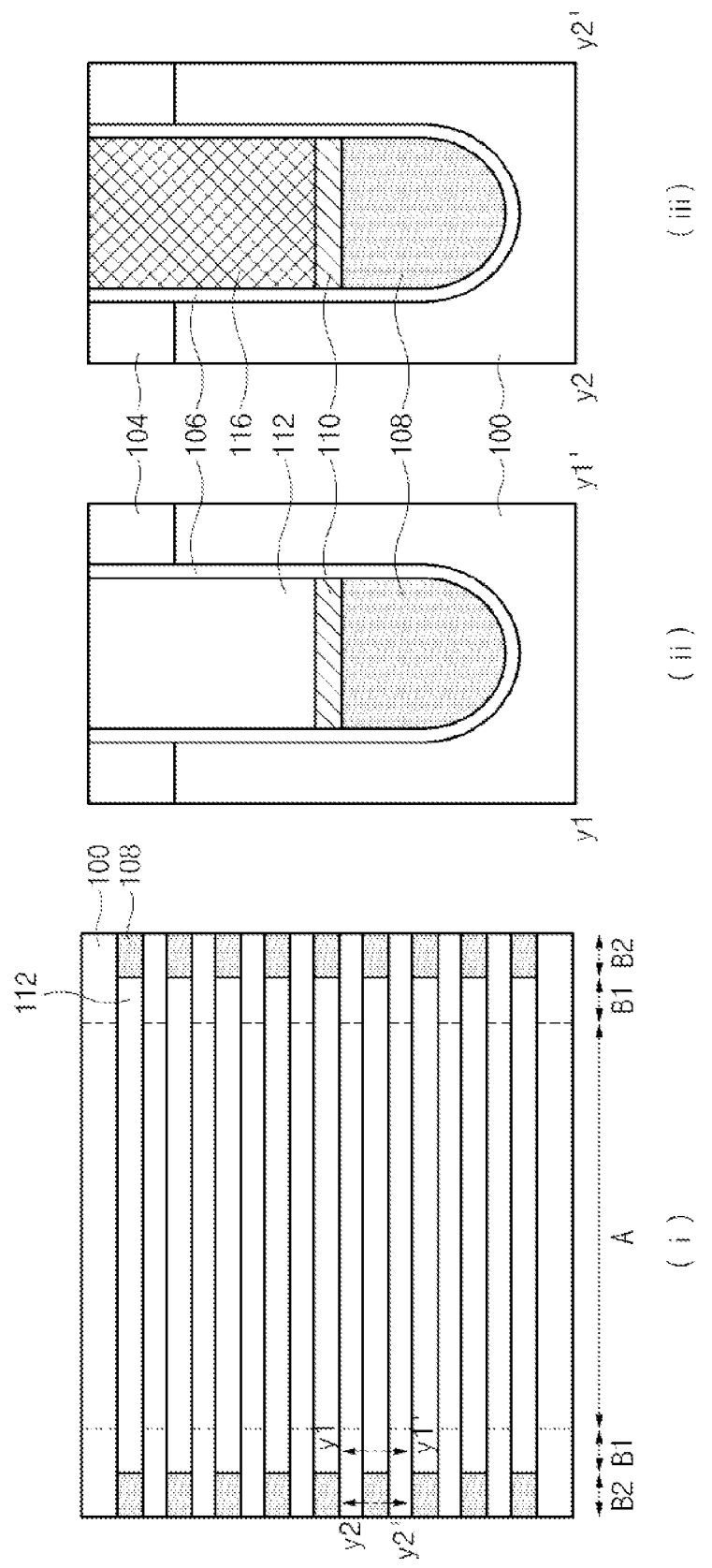

FIGS. 2E to 2G illustrate a method for forming a semiconductor device according to an embodiment of the present invention. In each of FIGS. 2E to 2G, (i) is a plan view illustrating a semiconductor device, (ii) is a cross-sectional view illustrating a semiconductor device taken along the line y1-y1' of (i), and (iii) is a cross-sectional view illustrating a semiconductor device taken along the line y2-y2' of (i). Generally, the buried gate is formed in the device isolation film of the first pad region B1 and the second pad region B2. However, for convenience of description and better understanding of the present invention, it is assumed that the buried gate is formed over the semiconductor substrate 100 as shown in FIGS. 2A to 2D. It is well known to those skilled in the art that the buried gate is formed over a device isolation film in the pad region. Therefore, although the buried gate is formed over the semiconductor substrate in the pad region for convenience of description, it should be understood that the buried gate is formed in the device isolation film.

Referring to FIG. 2E(i), a buried insulation film 112 is formed over the isolation insulation film 110 to fill the trench. The buried insulation film 112 may include Spin On Carbon (SOC).

Referring to FIGS. 2E(ii) and 2E(iii), after a mask pattern 114 is formed over the cell region A and the first pad region B1, a portion of buried insulation film 112 in the second pad region B2 is removed using the mask pattern 114 as an etch mask, exposing an upper surface of isolation insulation film 110 in the second pad region B2. Thereafter, the mask pattern 114 may be removed.

Referring to FIGS. 2F(ii) and 2F(iii), a sealing insulation film 116 may be formed over the isolation insulation film 110 to fill the trench in the second pad region B2. The sealing insulation film 116 may include a nitride film. For convenience of description and better understanding of the present invention, in order to clearly express the buried gate, the sealing insulation film 116 is not shown in the plan view of (i) but is shown in the cross-sectional views (iii). Therefore, only the first buried gate 108 is shown in the second pad region B2 shown in FIG. 2F(i), and the buried insulation film 112 is shown in the cell region and the first pad region B1.

Referring to (ii) and (iii) of FIG. 2G, the buried insulation film 112 formed in the cell region A and the first pad region B1 is removed. In an embodiment, the buried insulation film 112 and the sealing insulation film 116 have different etch selection ratios, so the sealing insulation film 116 is not removed when the buried insulation film 112 is removed by an etching process. Subsequently, a metal layer is formed over the cell region A and the isolation insulation film 110 of the first pad region B1, and is etched back, so that the second buried gate 118 is formed. Although not shown in FIG. 2G, the magnitude of the etching performed on the second buried gate 118 may be adjusted so that the second buried gate 118 overlaps with the ion implantation region formed in the semiconductor substrate 100 of the cell region A.

The first buried gate 108 may be longer than the second buried gate 118. The second buried gate 118 may be formed over the first buried gate 108 to expose both ends of the first buried gate 108 so that contacts configured to apply a bias voltage to each buried gate at the end part of each buried gate can be conveniently formed. The above-mentioned description can be more clearly understood from FIG. 2G(i).

Referring to FIG. 2G(i), the end part of the first buried gate 108 is exposed in the second pad region B2, and the second buried gate 118 formed over the first buried gate 108 is exposed in the cell region A and the first pad region B1.

Figure 2H:
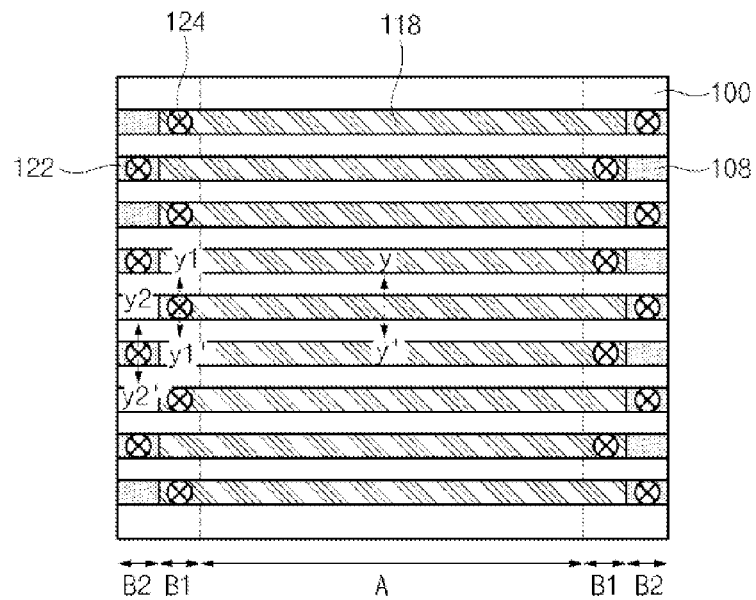
FIG. 2H illustrates a method for forming a semiconductor device according to an embodiment of the present invention.
Figure 2H:
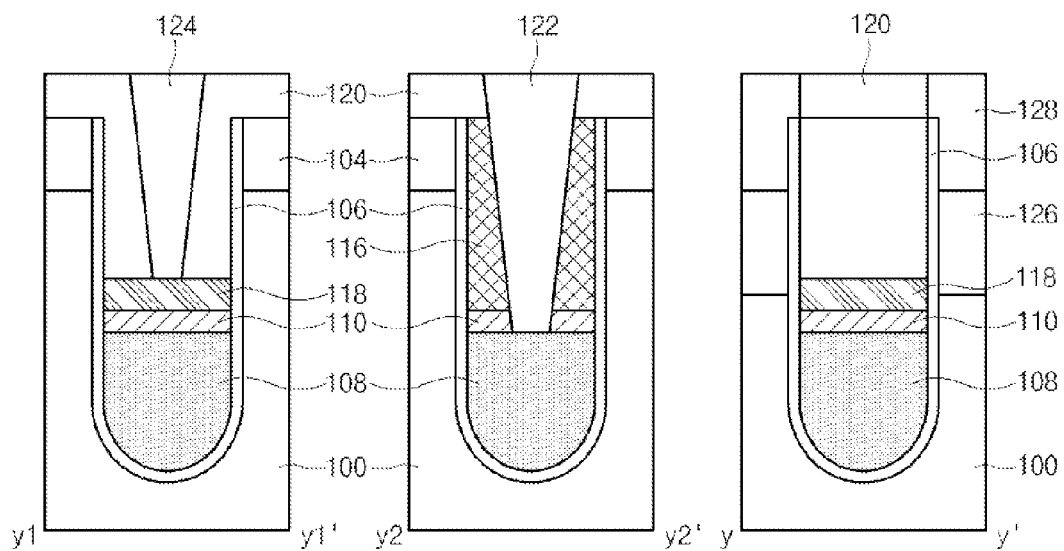

FIG. 2H illustrates a method for forming a semiconductor device according to an embodiment of the present invention. In FIG. 2H, (i) is a plan view illustrating a semiconductor device, (ii) is a cross-sectional view illustrating a semiconductor device taken along the line y1-y1' of (i), (iii) is a cross-sectional view illustrating a semiconductor device taken along the line y2-y2' of (i), and (iv) is a cross-sectional view illustrating a semiconductor device taken along the line y-y' of (i).

Referring to FIGS. 2H(ii) and 2H(iii), the sealing insulation film 120 is formed over the cell region and also over the second buried gate 118 of the first pad region B1. The sealing insulation film 120 may also be formed over the cell region A, the hard mask pattern 104 of the first pad region B1, and the second pad region B2. Subsequently, the sealing insulation film 120 is etched to expose the end part of the second buried gate 118 in the first pad region B1, so that a second contact hole is formed. The sealing insulation films 120 and 116 and the isolation insulation film 110 are etched to expose the first buried gate 108 in the second pad region B2, so that a first contact hole is formed.

Thereafter, a metal layer is formed to fill the first and second contact holes, so that a first metal contact 122 coupled to the first buried gate 108 is formed in the second pad region B2, and a second metal contact 124 coupled to the second buried gate 118 is formed in the first pad region B1.

Referring to FIG. 2H(i), a first metal contact 122 may be alternately located at both ends of the first buried gate 108. Similarly, the second metal contact 124 may be alternately located at both end of the second buried gate 118.

As shown in FIG. 2H(i), the first metal contact 122 and the second metal contact 124 may be arranged in a zigzag manner with respect to the first pad region B1 and the second pad region B2. In other words, if the first metal contact 122 is located at one end of the first buried gate 108, the second metal contact 124 may be located at the opposing end of the second buried gate 118 formed over the first buried gate 108.

Referring to FIG. 2H(iv), the first buried gate 108 and the second buried gate 118 are turned on so that channel resistance is reduced and a drive voltage of the semiconductor device is driven, resulting in an increase in operating speed. As described above, assuming that the first buried gate 108 and the second buried gate 118 are turned on, the turn-on voltage is applied to a first metal contact 122 coupled to the first buried gate 108 and to a second metal contact 124 coupled to the second buried gate 118.

When the first buried gate 108 is turned off and the second buried gate 118 is floated, a GIDL current is prevented from being generated and thus electric charges stored in a storage node are not lost or compromised. The second buried gate 118 is spaced apart from the first buried gate 108 by the isolation insulation film 110, and the second buried gate 118 and the first buried gate 108 are coupled to different contacts so that different bias voltages can be applied to the second buried gate 118 and the first buried gate 108. That is, assuming that the first buried gate 108 and the second buried gate 110 are turned off, a turn-off voltage is applied to the first buried gate 108 and no voltage is applied to the second buried gate 118.

The second buried gate 118 overlaps with the ion implantation region, so that channel resistance is reduced when the second buried gate 118 is activated. Conventional gates may include a single electrode that overlaps with ion implantation regions (i.e. source and drain), but while the overlap may reduce channel resistance, it can cause GIDL when a turn-on voltage is not applied to the gate. In contrast, embodiments of the present invention include a second buried gate which overlaps an ion implantation region to reduce channel resistance, but the second buried gate can be floated to prevent GIDL while a turn-off voltage is applied to a first buried gate. Thus, embodiments of the present invention may have the advantage of reduced channel resistance due to overlap with an ion implantation region while minimizing GIDL.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:
1. A semiconductor device comprising:
a semiconductor substrate including a cell region, a second pad region on one side of the cell region, and a first pad region disposed between the cell region and the second pad region and contiguous to the cell region and the second pad region;
a first buried gate buried in a trench, and extending from the cell region to the second pad region;
a second buried gate disposed in the trench over the first buried gate, spaced apart from an upper part of the first buried gate, and extending from the cell region to the first pad region;

a first metal contact coupled to an end part of the first buried gate; and a second metal contact coupled to an end part of the second buried gate, wherein, in the first pad region and the second pad region, a plurality of the first metal contacts and a plurality of the second metal contacts are arranged in a zigzag manner.

2. The semiconductor device according to claim 1, further comprising:

a plurality of the first buried gates arranged in parallel, each of the first buried gates having a first end and a second end; and a plurality of the first metal contacts, each of the plurality of first metal contacts respectively coupled to each of the plurality of the first buried gates, wherein the plurality of the first metal contacts are alternately coupled to the first end and the second end of neighboring first buried gates.

3. The semiconductor device according to claim 1, further comprising:

a plurality of the second buried gates arranged in parallel, each of the second buried gates having a first end and a second end; and a plurality of the second metal contacts, each of the plurality of second metal contacts respectively coupled to each of the plurality of the second buried gates, wherein the plurality of the first metal contacts are alternately coupled to the first end and the second end of neighboring second buried gates.

4. The semiconductor device according to claim 1, wherein the first metal contact is coupled to the first buried gate on a first side of the cell region, and the second metal contact is coupled to the second buried gate on a second side of the cell region.

5. The semiconductor device according to claim 1, wherein the first buried gate is longer than the second buried gate.

6. The semiconductor device according to claim 1, wherein the second buried gate is formed over the first buried gate to expose both ends of the first buried gate.

7. The semiconductor device according to claim 1, wherein the second buried gate overlaps with an ion implantation region contained in the semiconductor substrate of the cell region.

8. The semiconductor device according to claim 1, further comprising:

an isolation insulation film interposed between the first buried gate and the second buried gate.

9. The semiconductor device according to claim 8, wherein the isolation insulation film includes a nitride film.

10. The semiconductor device according to claim 1, further comprising:

a sealing insulation film disposed in the trench over the first buried gate and the second buried gate.

11. The semiconductor device according to claim 1, wherein, if the first buried gate and the second buried gate are turned on, a turn-on voltage is applied to the first metal contact and the second metal contact.

12. The semiconductor device according to claim 1, wherein, if the first buried gate and the second buried gate are turned off, a turn-off voltage is applied to the first metal contact and no voltage is applied to the second metal contact.

13. The semiconductor device according to claim 1, wherein, if no voltage is applied to the second metal contact, the second buried gate is floated.

14. A semiconductor device comprising:

a semiconductor substrate including a cell region, a second pad region on one side of the cell region, and a first pad region disposed between the cell region and the second pad region and contiguous to the cell region and the second pad region;

a first buried gate buried in a trench, and extending from the cell region to the second pad region;

a second buried gate disposed in the trench over the first buried gate, spaced apart from an upper part of the first buried gate, and extending from the cell region to the first pad region;

a first metal contact coupled to an end part of the first buried gate;

a second metal contact coupled to an end part of the second buried gate;

a plurality of the first buried gates arranged in parallel, each of the first buried gates having a first end and a second end; and a plurality of the first metal contacts, each of the plurality of first metal contacts respectively coupled to each of the plurality of the first buried gates, wherein the plurality of the first metal contacts are alternately coupled to the first end and the second end of neighboring first buried gates.

15. A semiconductor device comprising:

a semiconductor substrate including a cell region, a second pad region on one side of the cell region, and a first pad region disposed between the cell region and the second pad region and contiguous to the cell region and the second pad region;

a first buried gate buried in a trench, and extending from the cell region to the second pad region;

a second buried gate disposed in the trench over the first buried gate, spaced apart from an upper part of the first buried gate, and extending from the cell region to the first pad region;

a first metal contact coupled to an end part of the first buried gate;

a second metal contact coupled to an end part of the second buried gate;

a plurality of the second buried gates arranged in parallel, each of the second buried gates having a first end and a second end; and a plurality of the second metal contacts, each of the plurality of second metal contacts respectively coupled to each of the plurality of the second buried gates, wherein the plurality of the first metal contacts are alternately coupled to the first end and the second end of neighboring second buried gates.

* * * * *